US005655042A

United States Patent [19]
Atanovich et al.

[11] Patent Number: 5,655,042
[45] Date of Patent: Aug. 5, 1997

[54] MOLDED SLOTTED OPTICAL SWITCH STRUCTURE AND METHOD

[75] Inventors: Mark T. Atanovich; David L. Vowles, both of Phoenix, Ariz.

[73] Assignee: Motorola, Inc., Schaumburg, Ill.

[21] Appl. No.: 734,618

[22] Filed: Oct. 28, 1996

Related U.S. Application Data

[63] Continuation of Ser. No. 415,397, Apr. 3, 1995, abandoned.
[51] Int. Cl.⁶ .................................................... G02B 6/42
[52] U.S. Cl. ........................... 385/88; 385/92; 385/94; 257/82
[58] Field of Search .......................... 385/88–94, 16; 257/80, 81, 82, 99

[56] References Cited

U.S. PATENT DOCUMENTS 5,436,472   7/1995   Ogawa ........................... 257/82

OTHER PUBLICATIONS

Optek Technology, Inc., Product Bulletin, Slotted Optical Switch, May 1993, p.12–10.
Optek Technology, Inc., Product Bulletin, Hi-Rel Slotted Optical Switches, May 1989, pp. 102–112.

*Primary Examiner*—Phan T. H. Palmer
*Attorney, Agent, or Firm*—Kevin B. Jackson

[57] ABSTRACT

A molded slotted optical switch structure (21) includes a separate molded emitter portion (23) and a separate molded detector portion (24). The molded emitter portion (23) includes an emitter device (29) molded within an emitter housing (27). The molded detector portion includes a detector device (49) molded within a detector housing (47). The molded emitter portion (23) is coupled to the molded detector portion (24) to form a slot (57) with the emitter device (29) and the detector device (49) aligned with each other across the slot (57). Switching occurs when an opaque object passes through the slot (57) interrupting optical communication between the emitter device (29) and the detector device (49).

20 Claims, 3 Drawing Sheets

MOLDED SLOTTED OPTICAL SWITCH STRUCTURE AND METHOD

This application is a continuation of prior application Ser. No. 08/415,397, filed Apr. 3, 1995 now abandoned.

BACKGROUND OF THE INVENTION

This invention relates, in general, to optical devices, and more particularly, to molded slotted optical switch structures.

Slotted optical switch devices are well known and widely used in non-contact switching applications. Typically, slotted optical switches comprise a single, separate housing with discrete input and output devices inserted into the housing. The housing typically has a "u" shape with the input device in one upward portion of the housing and with the output device in the other upward portion of the housing. The two upward portions have a slot between them. The input and output devices are aligned so that switching occurs, for example, when an opaque object passes through the slot interrupting optical communication between the input and output devices.

Present discrete component slotted optical switches have several disadvantages including a high cost. The high cost comes from multiple piece parts that are expensive and the required labor to put the multiple piece parts together. Also, additional labor is required to make sure the input and output devices are in proper alignment. In addition, these devices are susceptible to moisture related failures.

One prior art optical switch comprises a single molded structure. This single molded structure has several disadvantages including complex molding techniques, poor yields, and long manufacturing cycle times. These disadvantages result in high manufacturing costs and long customer delivery lead times. Also, it is very difficult to manufacture lenses over the input and output devices in a single molded design. In addition, because the structure is a single unit, a manufacturer cannot use materials optimized for the input side and the output side. This impacts device performance because the materials that aid in the filtering of ambient light on the output side also attenuate radiant energy from the input side.

As is readily apparent, a slotted optical switch structure is needed that overcomes at least the above disadvantages.

DETAILED DESCRIPTION OF THE DRAWINGS

In general, the present invention relates to a molded slotted optical switch structure that comprises a molded two piece emitter and detector configuration. In particular, the present invention includes a separate molded emitter portion coupled to a separate molded detector portion. One can better understand the present invention with reference to FIGS. 1–6 together with the following description. Where appropriate, the same reference numbers are used in FIGS. 2–6 for ease of understanding.

Figure 1:
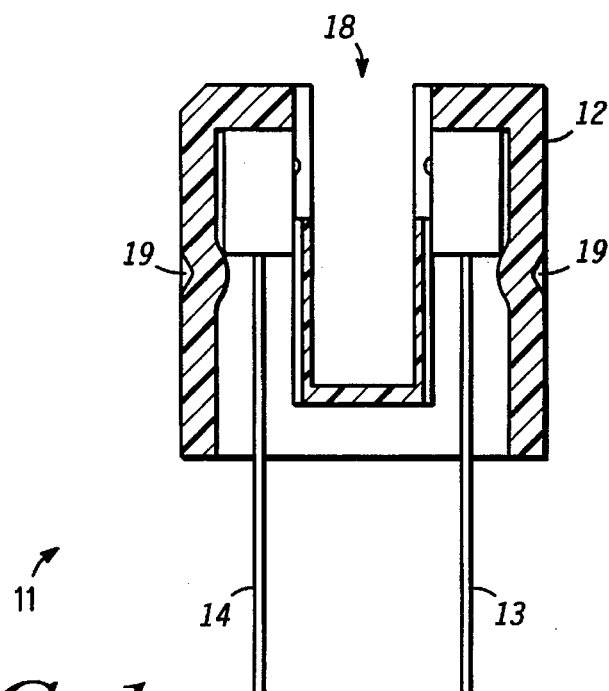
FIG. 1 illustrates an enlarged cross-sectional view of a prior art slotted optical switch.

FIG. 1 illustrates an enlarged cross-sectional view of a typical prior art slotted optical switch 11. Slotted optical switch 11 comprises a single-piece housing 12, a discrete input or emitter device 13, and a discrete output or detector device 14. Single-piece housing 12 typically is hollow and is shaped to provide a slot 18 between emitter device 13 and detector device 14.

Emitter device 13 is a separately assembled unit comprising an encapsulated leadframe structure such as a light emitting diode (LED) device assembled into a TO266 package or the like. Likewise, detector device 14 is a separately assembled unit comprising an encapsulated leadframe structure such as a photodiode assembled into a TO266 package or the like.

To assemble slotted optical switch 11, an assembler places emitter device 13 and detector device 14 into single-piece housing 12 such that the LED device and the photodiode device face each other. As shown in FIG. 1, emitter device 13 and detector device 14 are held in place using dimples 19. Dimples 19 are typically formed after emitter device 13 and detector device 14 are placed into single-piece housing 12. Optionally, emitter device 13 and detector device 14 are held in place using an adhesive.

Slotted optical switch 11 has several disadvantages including a high cost. This is due in part to expensive piece parts and the labor required to assembled the piece parts into a finished device. In addition, because single piece housing 12 is hollow, emitter device 13 and detector device 14 are susceptible to damage from moisture that migrates up the leads of the devices.

Figure 2:
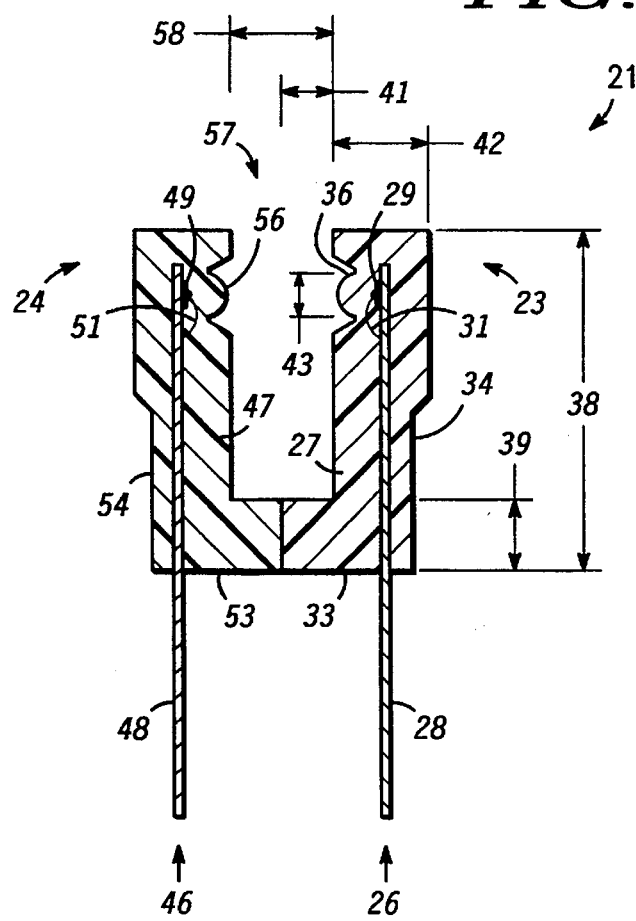
FIG. 2 illustrates an enlarged cross-sectional view of a molded slotted optical switch structure according to the present invention.

FIG. 2 illustrates an enlarged cross-sectional view of molded slotted optical switch structure or coupler device 21 according to the present invention. Molded slotted optical switch structure 21 includes a separate molded emitter or input portion 23 coupled to a separate molded detector or output portion 24. Molded emitter portion 23 preferably is coupled to molded detector portion 24 using an epoxy and/or, as will be explained in more detail below, an interlocking configuration.

Molded emitter portion 23 comprises an emitter or input leadframe structure 26 integrally molded within an emitter or molded input housing 27. As shown in FIG. 2, only a portion of emitter leadframe structure 26 is integrally molded within emitter housing 27. The amount molded typically depends on the application and/or the lead length required. Emitter leadframe structure 26 includes an emitter or input leadframe or conductive structure 28 and an emitter or input device 29 coupled to emitter leadframe 28. Emitter device 29 typically comprises an LED device or the like and is coupled to emitter leadframe 28 using well known die bond and wire bond techniques. Emitter device 29 is shown with an emitter wire bond 31, which connects emitter device 29 to one portion of emitter leadframe 28.

Emitter housing 27 is shown with an emitter or first base portion 33 and an emitter side or upright portion 34 extending from emitter base portion 33. Emitter housing 27 preferably includes an emitter lens 36 integrally molded into one side of emitter side portion 34. Emitter lens 36 functions to focus light emitted by emitter device 29. Preferably, emitter device 29 is substantially in alignment with emitter lens 36 to provide optimal focusing. Emitter housing 27 preferably comprises a clear polymer material such as a clear thermoset epoxy material. Such materials are available from Nitto and Hysol (e.g., Nitto NT-8500P-1100 or Hysol MG18).

Preferably, emitter housing 24 has a height 38 in a range from approximately 10.2 to 12.7 millimeters (mm) (approximately 400 to 500 mils). Emitter base portion 33 preferably has a height 39 in a range from approximately 2 to 2.5 mm (approximately 80 to 100 mils). Emitter base portion 33 preferably extends a width 41 out from emitter side portion 34 in range from approximately 1.3 to 1.8 mm (approximately 50 to 70 mils). Emitter side portion 34 preferably has a width 42 in range from approximately 5.0 to 7.0 mm (approximately 195 to 275 mils). Emitter lens 36 preferably has a diameter 43 in range from approximately 1.0 to 2.0 mm (approximately 40 to 79 mils). Shapes for emitter lens 36 are well known in the art.

Molded detector portion 24 comprises a detector or output leadframe structure 46 integrally molded within a detector or molded output housing 47. As shown in FIG. 2, only a portion of detector leadframe structure 46 is integrally molded within detector housing 47. The amount molded depends upon the application and/or the lead length required. Preferably, molded detector portion 24 has the same dimensions as molded emitter portion 23 so that a manufacturer can use the same mold to produce both portions. Detector leadframe structure 46 comprises a detector or output leadframe or conductive structure 48 and a detector or output device 49 coupled to detector leadframe 48. Detector device 49 comprises a photodiode, a schmitt trigger device, a darlington transistor device, or the like. Detector device 49 is coupled to detector leadframe 48 using well known die bond and wire bond techniques. Detector device 49 is shown with a detector wire bond 51, which connects detector device 49 to a portion of detector leadframe 48.

Like emitter housing 27, detector housing 47 includes a detector or second base portion 53 and a detector side or upright portion 54 extending from detector base portion 53. Detector housing 47 preferably includes a detector lens 56 molded into one side of detector side portion 54 to focus the light emitted from emitter device 29 onto detector device 49. Preferably, detector device 49 is substantially in alignment with detector lens 56 to provide optimal focusing. Typically, detector lens 56 has the same diameter as emitter lens 36. Shapes for detector lens 56 are well known in the art. Preferably, detector housing 47 comprises a visible light filter polymer material such as an NT-8500P-9100 available from Nitto. Optionally, both emitter housing 27 and detector housing 47 comprise a clear material (e.g., Nitto NT-8500P-1100) to provide lower cost.

Preferably, the materials used to mold emitter housing 27 and detector housing 47 are of different colors to provide a manufacturer with a quick polarity reference when slotted optical switch structure 21 is placed, for example, in a printed circuit board. This is easily accomplished when emitter housing 27 comprises a clear material and when detector housing comprises a visible light filter material. Molded emitter portion 23 and molded detector portion 24 are formed using well known transfer molding techniques.

When molded emitter portion 23 and molded detector portion 24 are coupled together, emitter device 29 and detector device 49 face each other and are substantially in alignment to transmit and receive an optical signal. Emitter side portion 34 is spaced a distance 58 from detector upright portion 54 to provide a slot 57. Typically, distance 58 is at least 2.6 to 3.6 mm (approximately 100 to 140 mils). Width 41 and thus distance 58 can be greater depending on the application. Alternatively, a manufacturer can control distance 58 with a spacer such as that shown in FIG. 5 and explained in more detail below.

Molded slotted optical switch structure 21 has several advantages of over prior art slotted optical switch 11 shown in FIG. 1. In particular, molded slotted optical switch structure 21 is less susceptible to moisture damage because emitter device 29 and detector device 49 are integrally molded into emitter housing 27 and detector housing 47 respectively. This creates a longer moisture creep path compared to slotted optical switch 11.

Also, molded slotted optical switch structure 21 provides a built-in alignment between emitter device 29 and detector device 49 thus eliminating any manual alignment requirements. The built-in alignment results from the tight tolerances achievable with currently available molding techniques and a reduction of stack-up tolerances. The improved alignment capability increases optical efficiency.

In addition, molded optical switch structure 21 uses existing die bond, wire bond, and molding technologies making it cost effective and supportive of high speed manufacturing techniques. Additionally, the formation of lenses 36 and 56 is more simple and repeatable compared to existing single piece molded devices. This provides a manufacturer more flexibility in lens design. Furthermore, because of the two piece design, a manufacturer can utilize materials optimized for the emitter portion and the detector portion.

Figure 3:
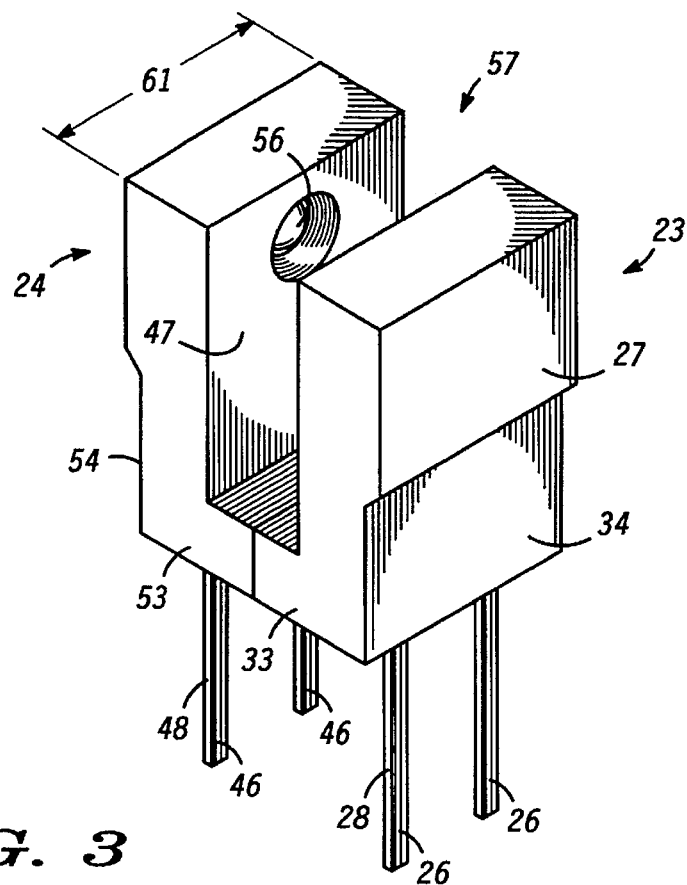
FIG. 3 illustrates an enlarged perspective view of the molded slotted optical switch structure of FIG. 2.

FIG. 3 is an enlarged perspective view of slotted optical switch structure 21 shown in FIG. 2. Like reference numbers are used for convenience. In this embodiment, emitter leadframe 28 and detector leadframe 48 are shown in a straight two lead configuration. It is understood that other lead configurations are easily incorporated. Preferably, molded emitter portion 23 and molded detector portion 24 have a width 61 in a range from approximately 3.8 to 6.4 mm (approximately 150 to 250 mils).

Figure 4:
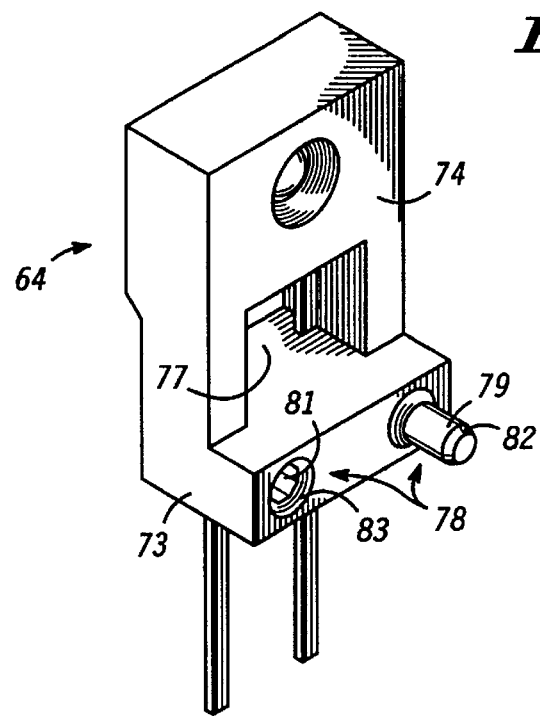
FIG. 4 illustrates an enlarged perspective view of a portion of a molded slotted optical switch structure according to a preferred embodiment of the present invention.

FIG. 4 is an enlarged perspective view of a portion of a molded slotted optical switch according to a preferred embodiment. For example, the portion is a molded detector portion 64 that includes a detector base portion 73 and a detector upright or side portion 74. Detector upright portion 74 is shown with an optional cored-out portion 77, which preferably extends from one side of detector upright portion 74 to an opposite side. In some applications, cored-out portion 77 is preferred for cost savings because less material is needed to form molded detector portion 64. Cored-out portion 77 is formed in either one or both of the upright portions. In applications where excessive moisture is present, upright portions such as emitter upright or side portion 34 and detector upright or side portion 54 shown in FIG. 3 are preferred to better protect the detector and emitter devices.

Detector base portion 73 is shown with a preferred press-fitting or inter-locking structure 78 for coupling molded detector portion 64 to a molded emitter portion. Press-fitting structure 78 preferably comprises a coupling post or pin 79 and a coupling hole or socket 81 adjacent to coupling post 79. Preferably, the molded emitter portion has a second coupling post arranged to couple with coupling socket 81 and a second coupling socket arranged to receive coupling post 79. This is easily achieved when the same mold is used to manufacture both molded detector portion 64 and the molded emitter portion. Optionally, molded detector portion 64 has two coupling posts and the molded emitter portion has two coupling sockets.

Preferably, coupling post 79 and coupling socket 81 are shaped to provide an inter-locking structure. This is achieved, for example, by one of coupling post 79 and coupling socket 81 having a multi-sided shape and the other having round or different shape. Preferably, coupling post 79 and coupling socket 81 include a chamfer or beveled portion 82 and 83 respectively to provide easier insertion during assembly. Preferably, coupling post 79 has a length on the order of approximately 1.5 mm (approximately 60 mils) and a diameter on the order of approximately 0.75 mm (approximately 30 mils).

Other inter-locking structures are possible including one coupling post on one base portion and one coupling socket on the other base portion or multiple coupling posts on one base portion and multiple coupling sockets on the other base portion. Alternatively, a snap-fit structure is used. Optionally, an adhesive is used with or without inter-locking structure 78 to couple molded detector portion 64 to a molded emitter portion.

Figure 5:
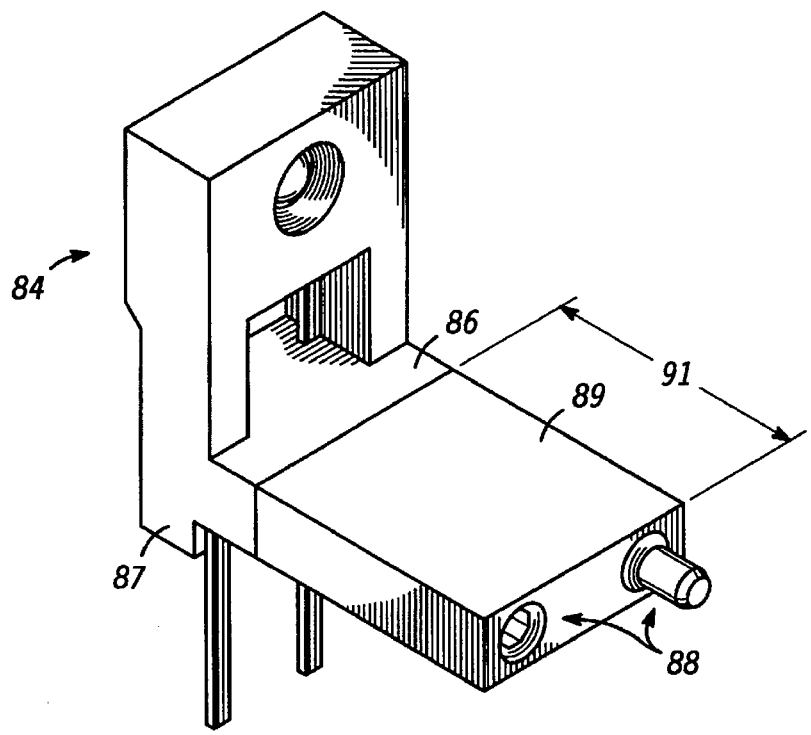
FIG. 5 illustrates an enlarged perspective view of another embodiment of a portion of a molded slotted optical switch structure according to the present invention.

FIG. 5 illustrates an enlarged perspective view of a portion of a molded slotted optical switch structure according to another embodiment of the present invention. For example, the portion is a molded detector portion 84 that includes a base portion 86. Base portion 86 is shown with an optional standoff 87 that provides a gap between the molded optical switch device and the application board or device when the molded slotted optical switch device is coupled to it. Although not shown, the molded emitter device preferably would have a standoff also when standoffs are included in the structure. Standoff 87 can be a single strip, a single foot, or multiple feet.

A spacer or insert 89 is shown coupled to base portion 86. In a fully assembled device, spacer 89 is coupled between the detector portion and the emitter portion. Spacer 89 preferably includes an inter-locking structure 88, which is designed to accommodate interlocking structure 78. Optionally, an adhesive is used with or without inter-locking structure 88 to couple molded detector portion 84 and a molded emitter portion to spacer 89. Spacer 89 allows a manufacturer to customize the width of the slot. Typically, spacer 89 has a length 91 less than approximately 13 mm (approximately 500 mils) to provide optimum resolution positioning sensing. Optionally, a manufacturer can customize slot width using well known mold insert techniques.

Figure 6:
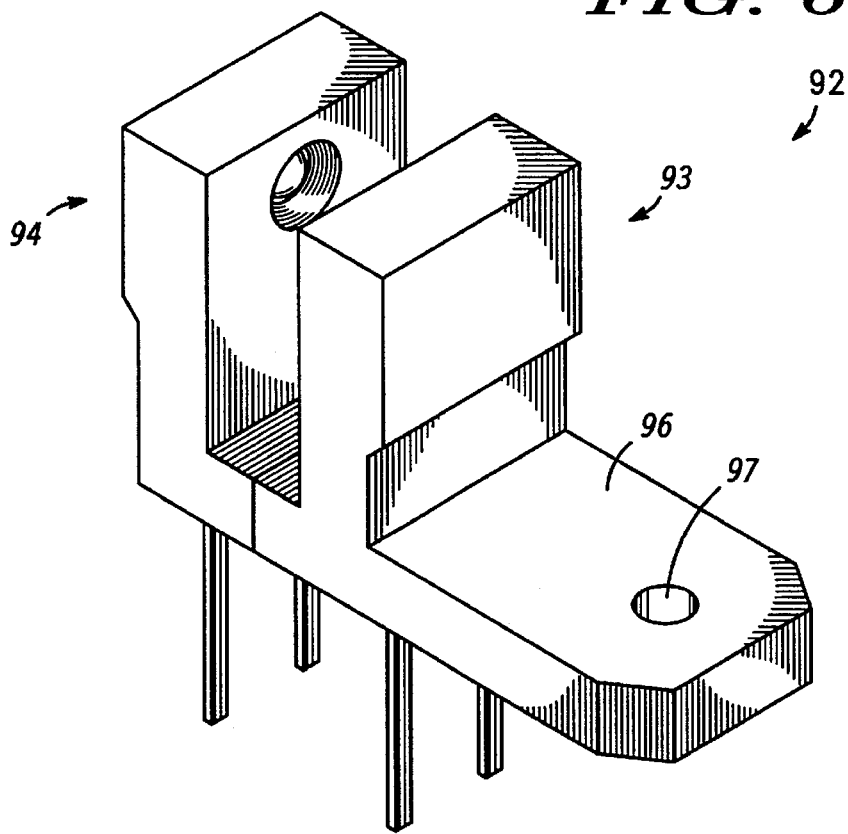
FIG. 6 illustrates an enlarged perspective view of an additional embodiment of a molded slotted optical switch structure according to the present invention.

FIG. 6 illustrates an enlarged perspective view of a molded slotted optical switch structure 92 according to an additional embodiment of the present invention. Molded slotted optical switch structure 92 includes molded emitter portion 93 and molded detector portion 94 coupled to molded emitter portion 93. In this embodiment, molded emitter portion 93 includes a mounting tab 96 having a mounting hole 97. Mounting tab 96 allows a manufacturer to couple molded slotted optical switch structure 92 to an application board using fastener devices such as screws, rivets, or the like. Optionally, a mounting tab is on molded detector portion 94 or mounting tabs are on both molded emitter portion 93 and molded detector portion 94.

By now it should be appreciated that there has been provided a molded slotted optical switch structure that overcomes the significant disadvantages of prior art structures. While we have shown and described specific illustrative embodiments of the present invention, further modifications and improvements will occur to those skilled in the art. We desire it to be understood, therefore, that this invention is not limited to the particular forms shown and we intend the appended claims to cover all modifications that do not depart from the spirit and scope of this invention.

We claim:

1. A molded slotted optical switch structure having a two piece housing comprising:

an input device;

a separate input portion including a molded input housing having a first base portion, a first upright portion extending from the first base portion, wherein the input device is integrally molded within the first upright portion, and wherein the separate input portion forms a first piece of the two piece housing;

an output device; and a separate output portion including a molded output housing having a second base portion and a second upright portion extending from the second base portion, wherein the output device is integrally molded with the second upright portion, and wherein the separate output portion forms a second piece of the two piece housing, and wherein the molded input portion is coupled to the molded output portion such that the input device faces the output device, and wherein the first upright portion is spaced a distance from the second upright portion to form a slot.

2. A structure according to claim 1 further comprising means for press-fitting the molded input housing to the molded output housing, the means for press-fitting integrally molded into the first and second base portions.

3. A structure according to claim 1 further comprising a spacer coupled between the molded input housing and molded output housing to increase the distance between the input device and the output device.

4. A structure according to claim 3 further comprising means for press-fitting the molded input housing and the molded output housing to the spacer, the means for press-fitting integrally molded into the spacer and the first and second base portions.

5. A structure according to claim 1 further comprising a first lens formed in one side of the first upright portion such that the input device is substantially in alignment with the first lens, and a second lens formed in one side of the second upright portion such that the output device is substantially in alignment with the second lens, wherein the molded input housing comprises a material having a first color, and wherein the molded output housing comprises a material having a second color different than the first color.

6. A structure according to claim 1 wherein one of the first upright portion and the second upright portion includes a cored-out portion.

7. A molded slotted optical coupler device have at least a two piece housing comprising:

an emitter leadframe;

an emitter device coupled to the emitter leadframe to form an emitter leadframe structure;

an emitter housing including a first side portion and a first base portion, a portion of the emitter leadframe structure integrally molded into the emitter housing, wherein the emitter housing forms one piece of the at least two piece housing;

a detector leadframe;

a detector device coupled to the detector leadframe to form a detector leadframe structure; and a detector housing including a second side portion and a second base portion, a portion of the detector leadframe structure integrally molded into the detector housing, wherein the detector housing forms another piece of the at least two piece housing, and wherein the detector housing is coupled to the emitter housing such that the first side portion and the second side portion are spaced a distance apart, and wherein the first side portion and the second side portion form a slot, and wherein the emitter device and the detector device face each other and are substantially in alignment.

8. A device according to claim 7 further comprising a first lens molded into the first side portion substantially over the emitter device.

9. A device according to claim 8 further comprising a second lens molded into the second side portion substantially over the detector device.

10. A device according to claim 7 wherein the first base portion includes a first coupling post and a first coupling hole, and wherein the second base portion includes a second coupling post and a second coupling hole, the first coupling hole arranged to receive the second coupling post, the second coupling hole arranged to receive the first coupling post.

11. A device according to claim 10 wherein the first and second coupling posts and the first and second coupling holes have different shapes to provide an interlocking structure.

12. A device according to claim 10 wherein the first and second coupling posts and the first and second coupling holes include a chamfer portion.

13. A device according to claim 7 further comprising a spacer coupled between the first base portion and the second base portion to increase the distance between the first side portion and the second side portion.

14. A device according to claim 7 wherein one of the first base portion and the second base portion includes a standoff.

15. A device according to claim 7 wherein one of the first base portion and the second base portion includes a mounting tab having a hole.

16. A device according to claim 7 wherein the emitter housing comprises a first material and the detector housing comprises a second material different than the first material.

17. A device according to claim 16 wherein the emitter housing comprises a clear material and the detector housing comprises a visible light filter material.

18. A method for forming a molded slotted optical switch structure comprising the step of:

forming a separate molded emitter portion including a molded emitter housing having an emitter base portion, an emitter side portion, and an emitter device molded within the emitter side portion;

forming a separate molded detector portion including a molded detector housing having a detector base portion, a detector side portion, and a detector device molded within the detector side portion; and coupling the separate molded emitter portion to the separate molded detector portion such that the separate molded emitter portion and the separate molded detector portion are spaced a distance apart to form a slot.

19. A method according to claim 18 further comprising the step of providing a spacer before the step of coupling and wherein the step of coupling includes coupling the separate molded emitter portion to one side of the spacer and coupling the separate molded detector portion to an opposite side the spacer such that the distance between the separate molded emitter portion and the separate molded detector portion is increased.

20. A method according to claim 18 wherein the step of forming the separate molded emitter portion includes forming a separate molded emitter portion having a first coupling post and a first coupling hole on the emitter base portion and an emitter lens on the emitter side portion, and wherein the step of forming the separate molded detector portion includes forming a separate molded detector portion having a second coupling post and a second coupling hole on the detector base portion and a detector lens on the detector side portion.

* * * * *